United States Patent
Nishijima et al.

(10) Patent No.: US 7,128,846 B2
(45) Date of Patent: Oct. 31, 2006

(54) PROCESS FOR PRODUCING GROUP III NITRIDE COMPOUND SEMICONDUCTOR

(75) Inventors: Kazuki Nishijima, Aichi (JP); Masanobu Senda, Aichi (JP); Toshiaki Chiyo, Aichi (JP); Jun Ito, Aichi (JP); Naoki Shibata, Aichi (JP); Toshimasa Hayashi, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/505,948

(22) PCT Filed: Feb. 24, 2003

(86) PCT No.: PCT/JP03/01990

§ 371 (c)(1),
(2), (4) Date: Aug. 27, 2004

(87) PCT Pub. No.: WO03/072856

PCT Pub. Date: Sep. 4, 2003

(65) Prior Publication Data

US 2005/0118825 A1    Jun. 2, 2005

(30) Foreign Application Priority Data

Feb. 28, 2002   (JP)   ............... 2002-055094

(51) Int. Cl.
*C23F 1/00*   (2006.01)
*C30B 29/38*  (2006.01)

(52) U.S. Cl. ............ 216/76; 216/77; 438/341; 438/481; 438/722; 117/952; 257/190

(58) Field of Classification Search ............ None
See application file for complete search history.

(56) References Cited

U.S. PATENT DOCUMENTS

| 6,153,010 A | 11/2000 | Kiyoku et al. |
| 6,426,519 B1 * | 7/2002 | Asai et al. ............ 257/103 |
| 6,489,221 B1 * | 12/2002 | Gehrke et al. ........ 438/479 |
| 6,620,238 B1 * | 9/2003 | Tsuda et al. ......... 117/90 |

(Continued)

FOREIGN PATENT DOCUMENTS

EP   1 265 272 A1 * 11/2002

(Continued)

OTHER PUBLICATIONS

Wolf et al., Silicon Processing for the VLSI Era, 1986, Lattice Press, vol. 1, pp. 110-111.*

(Continued)

*Primary Examiner*—Nadine Norton
*Assistant Examiner*—Eric B. Chen
(74) *Attorney, Agent, or Firm*—McGinn IP Law Group, PLLC

(57) ABSTRACT

A method including the steps of: modifying at least one part of a sapphire substrate by dry etching to thereby form any one of a dot shape, a stripe shape, a lattice shape, etc. as an island shape on the sapphire substrate; forming an AlN buffer layer on the sapphire substrate; and epitaxially growing a desired Group III nitride compound semiconductor vertically and laterally so that the AlN layer formed on a modified portion of the surface of the sapphire substrate is covered with the desirably Group III nitride compound semiconductor without any gap while the AlN layer formed on a non-modified portion of the surface of the sapphire substrate is used as a seed, wherein the AlN buffer layer is formed by means of reactive sputtering with Al as a target in an nitrogen atmosphere.

20 Claims, 2 Drawing Sheets

U.S. PATENT DOCUMENTS 6,855,620 B1 * 2/2005 Koike et al. ................. 438/481

FOREIGN PATENT DOCUMENTS

| JP | 5-41536 | 2/1993 |
| JP | 5-343741 | 12/1993 |
| JP | 7-273367 | 10/1995 |
| JP | 8-64791 | 3/1996 |
| JP | 2000-357843 | 12/2000 |
| WO | WO 97/11518 | 3/1997 |
| WO | WO 01/48798 A1 | 7/2001 |
| WO | WO 01/69661 A1 * | 9/2001 |
| WO | WO 01/69662 A1 | 9/2001 |

OTHER PUBLICATIONS

Prochnow et al., Preparing Precision Ultrafine Sapphire Surfaces: A Practical Method, Aug. 15, 1986, Applied Optics, vol. 25, No. 16, pp. 2639-2640.*

* cited by examiner

FIG. 2

| SAMPLE | RHEED IMAGE | |
|---|---|---|
| SAPPHIRE | (ARBITRARY ANGLE θ) | (ARBITRARY ANGLE θ) |
| (a) AlN BUFFER LAYER WITHOUT ETCHING | (ARBITRARY ANGLE θ) | (ARBITRARY ANGLE θ) |
| (b) AlN BUFFER LAYER ETCHED WITH Ar FOR 5 MINUTES (DEPTH: ABOUT 2nm) | (ARBITRARY ANGLE θ) | (ARBITRARY ANGLE θ) |

PROCESS FOR PRODUCING GROUP III NITRIDE COMPOUND SEMICONDUCTOR

TECHNICAL FIELD

The present invention relates to a method for producing a Group III nitride compound semiconductor. Particularly it relates to a method for producing a Group III nitride compound semiconductor by using epitaxial lateral overgrowth (ELO), a Group III nitride compound semiconductor device and a Group III nitride compound semiconductor substrate. Incidentally, the Group III nitride compound semiconductor may be represented by the general formula $Al_xGa_yIn_{1-x-y}N$ ($0 \leq x \leq 1$, $0 \leq y \leq 1$, $0 \leq x+y \leq 1$) which includes: binary compounds such as AlN, GaN and InN; ternary compounds such as $Al_xGa_{1-x}N$, $Al_xIn_{1-x}N$ and $Ga_xIn_{1-x}N$ (0x<1 each); and quaternary compounds such as $Al_xGa_yIn_{1-x-y}N$ (0<x<1, 0<y<1, 0<x+y<1). In this description, the expression "Group III nitride compound semiconductor" simply implies a Group III nitride compound semiconductor doped with impurities to change the conduction type to a p type or an n type if no further notice is given particularly.

BACKGROUND ART

For example, a Group III nitride compound semiconductor used in a light-emitting device is a direct transition type semiconductor exhibiting an emission spectrum in a wide range of from ultraviolet to red. The Group III nitride compound semiconductor is applied to a light-emitting device such as a light-emitting diode (LED), a laser diode (LD), or the like. Application of the Group III nitride compound semiconductor to a transistor such as an FET or the like has been developed actively because the band gap of the Group III nitride compound semiconductor is so wide that the device using the Group III nitride compound semiconductor can be expected to operate more stably at a high temperature than a device using another semiconductor. Development of the Group III nitride compound semiconductor into various general semiconductor devices has been expected from the environmental viewpoint because arsenic is not used as the main component. Generally, the Group III nitride compound semiconductor is formed on sapphire used as a substrate.

If the Group III nitride compound semiconductor is formed on such a sapphire substrate, dislocation is caused by misfit in lattice constant between sapphire and the Group III nitride compound semiconductor. For this reason, there is a problem that device characteristic becomes poor. The dislocation caused by the misfit is threading dislocation that passes through a semiconductor layer vertically (in a direction perpendicular to a substrate surface). There is a problem that dislocation of about $10^9$ $cm^{-2}$ propagates in the Group III nitride compound semiconductor. When Group III nitride compound semiconductor layers different in composition are laminated, it propagates up to the uppermost layer. For example, in the case of a light-emitting device, there is therefore a problem that device characteristic such as threshold current in LD, device life in LD and LED, etc. cannot be improved. Also in the case of another semiconductor device, no device but a semiconductor device low in mobility can be formed because electrons are scattered by defects. These problems occur also in the case where another substrate is used.

For example, there has been accordingly proposed a method in which: a Group III nitride compound semiconductor layer is once formed on a substrate with or without interposition of a buffer layer; a mask is formed on part of an upper surface of the Group III nitride compound semiconductor layer so that the Group III nitride compound semiconductor cannot be epitaxially grown vertically from the masked portion; and the Group III nitride compound semiconductor is epitaxially grown vertically and laterally from the non-masked portion to thereby form a Group III nitride compound semiconductor layer low in threading dislocation above the masked portion.

In the technique described in the official gazette, it is however necessary to perform Group III nitride compound semiconductor growth twice before and after masking because different apparatuses are used for Group III nitride compound semiconductor growth and masking respectively. Moreover, in the technique described in the official gazette, a space is apt to be formed between the Group III nitride compound semiconductor layer formed above the masked portion and the mask because the Group III nitride compound semiconductor cannot be formed on them asked portion with good adhesion. As a result, when separation into devices is performed in an after-process, peeling, cracking or chipping occurs in the portion where the space is formed.

The invention has been made to solve the aforementioned problems and an object of the invention is to provide a semiconductor device in which a Group III nitride compound semiconductor layer suppressed in terms of threading dislocation is formed by a smaller number of steps as a whole and in which peeling, cracking or chipping hardly occurs.

DISCLOSURE OF THE INVENTION

According to the invention, a method for producing a Group III nitride compound semiconductor by growing the Group III nitride compound semiconductor on a sapphire substrate through an AlN buffer layer is provided. The production method includes the steps of: modifying at least one part of a surface of the sapphire substrate by dry etching; forming the AlN buffer layer on the modified sapphire substrate; and epitaxially growing a desired Group III nitride compound semiconductor vertically and laterally on the AlN buffer layer while the AlN buffer layer formed on a non-modified portion of the surface of the sapphire substrate is used as a seed. The AlN buffer layer is formed by means of reactive sputtering with Al as a target in a nitrogen atmosphere.

Desirably, the step of modifying the surface of the sapphire substrate is carried out so that any one of a dot shape, a stripe shape, a lattice shape, etc., is formed as an island shape on a flat surface of the sapphire substrate. When modified, the sapphire substrate is etched. Desirably, the depth of etching of the sapphire substrate is set to be not larger than the thickness of the AlN buffer layer. Desirably, the sapphire substrate is a substrate having a face A as a principal surface. After the Group III nitride compound semiconductor is formed, a different type Group III nitride compound semiconductor layer can be laminated thereon to thereby form a Group III nitride compound semiconductor device. In addition, when almost all parts except the vertically and laterally epitaxially grown Group III nitride compound semiconductor are removed, a Group III nitride compound semiconductor substrate can be obtained.

Although there has been already proposed a technique in which a difference in level, a surface roughness, or the like is provided on a surface of a substrate so that a Group III nitride compound semiconductor can be epitaxially laterally overgrown, a method particularly remarkably effective in producing a Group III nitride compound semiconductor can be found by the subsequent examination when a substrate, a substrate surface and a buffer layer and methods for forming these are combined as follows. According to the invention, modification of the surface of the sapphire substrate can be achieved by etching in a very short time without necessity of forming a difference of 0.1 µm in level. According to the invention, epitaxial growth of the Group III nitride compound semiconductor can be made continuously from vertical and lateral epitaxial growth on the AlN buffer layer. Because the AlN buffer layer is formed by means of reactive sputtering, the growth of the Group III nitride compound semiconductor can be made by integrated production after the substrate is mounted in a Group III nitride compound semiconductor growth apparatus. Accordingly, a Group III nitride compound semiconductor layer suppressed in terms of threading dislocation can be formed by a smaller number of steps as a whole.

BRIEF DESCRIPTION OF THE DRAWINGS

FIG. 2(a) is a photograph of an RHEED image of an AlN layer 4a formed on a non-modified portion of a sapphire substrate, and FIG. 2(b) is a photograph of an RHEED image of an AlN layer 4b formed on a modified portion of the sapphire substrate.

BEST MODE FOR CARRYING OUT THE INVENTION

Figure 1:
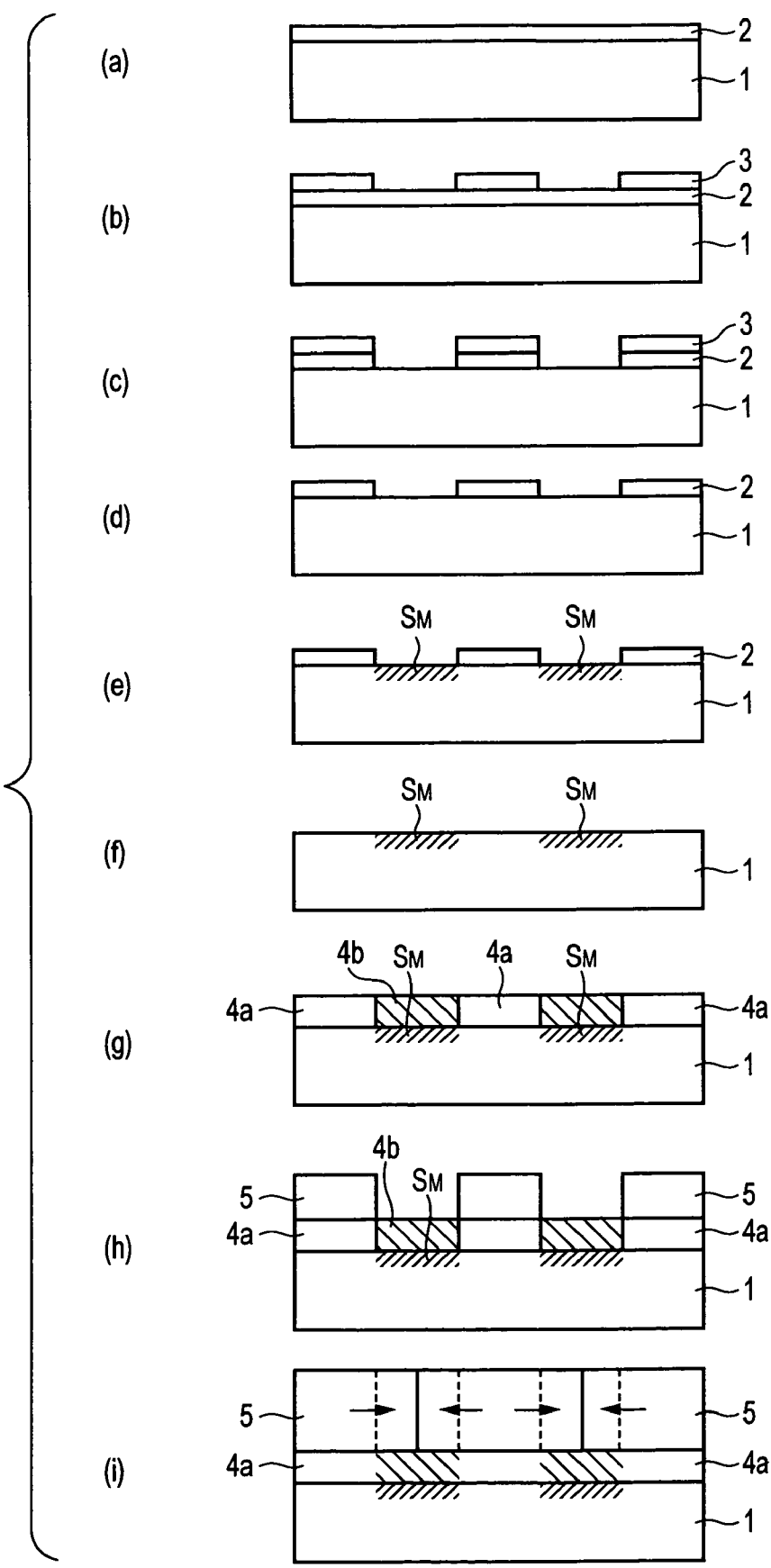
FIGS. 1(a) to 1(i) are sectional views showing a process of producing a Group III nitride compound semiconductor according to an embodiment of the invention.

A Group III nitride compound semiconductor according to the invention is produced by vapor-phase growth using a metal organic vapor-phase epitaxy method (hereinafter referred to as "MOVPE") Gases used are ammonia ($NH_3$), carrier gas ($H_2$ or $N_2$), trimethyl gallium ($Ga(CH_3)_3$, hereinafter referred to as "TMG"), trimethyl aluminum ($Al(CH_3)_3$, hereinafter referred to as "TMA"), trimethyl indium ($In(CH_3)_3$, hereinafter referred to as "TMI"), and cyclopentadienyl magnesium ($Mg(C_5H_5)_2$, hereinafter referred to as "$Cp_2Mg$").

EMBODIMENT

In the condition that a face A of a mono-crystalline sapphire substrate 1 cleaned by organic cleaning was used as a principal surface, that is, as a crystal growth surface, a 50-nm thick Ni film 2 was deposited on the mono-crystalline sapphire substrate 1 by means of vapor deposition (FIG. 1(a)) Then, the Ni film 2 was coated with a photo resist 3 and the photo resist 3 was patterned in the form of stripes on the face A, that is, on the flat surface by photolithography. The patterning was made in a direction perpendicular to the axis c of the sapphire substrate 1 so that both the width of each stripe of the photo resist 3 and the distance between adjacent stripes of the photo resist 3 were 5 µm (FIG. 1(b)).

Then, the Ni film 2 was removed with acid from portions where the photo resist 3 had been already removed (FIG. 1(c)). Then, the photo resist 3 was removed by organic cleaning. In this manner, an etching mask of the Ni film 2 was formed to have 5 µm-wide and 5 µm-distant stripes arranged in a direction perpendicular to the axis c of the sapphire substrate 1 (FIG. 1(d)).

Then, the sapphire substrate 1 was etched in Ar for 5 minutes by means of dry etching (FIG. 1(e)). Then, the etching mask of the Ni film 2 was removed. On this occasion, a difference of about 2 nm in level was formed between the portion of the sapphire substrate 1 where the etching mask was formed and the portion thereof where the etching mask was not formed. In this manner, a non-modified portion and a portion $S_M$ modified in atomic order by etching were formed on the face A of the sapphire substrate (FIG. 1(f)).

Then, a DC magnetron sputtering apparatus was used so that a buffer layer 4 of AlN was formed by means of reactive sputtering in nitrogen gas with high-purity metallic aluminum as a target. The buffer layer was formed with a thickness of about 60 nm on the whole face A of the sapphire substrate (FIG. 1(g)).

FIG. 2(a) shows an RHEED image of an AlN layer 4a formed on the non-modified portion of the sapphire substrate. There are poly-crystalline spots observed. On the other hand, FIG. 2(b) shows an RHEED image of an AlN layer 4b formed on the modified portion of the sapphire substrate. There is no spot observed. In this manner, although the AlN layer 4a formed on the non-modified portion of the sapphire substrate functions as a buffer layer, the AlN layer 4b formed on the modified portion of the sapphire substrate does not function as a buffer layer so that it is impossible to produce any seed of Group III nitride compound semiconductor when the Group III nitride compound semiconductor will be epitaxially grown after that. Accordingly, vertical and lateral epitaxial growth can be made mainly on the AlN layer 4a formed on the non-modified portion of the sapphire substrate.

Then, in the condition that 20 L/min of $H_2$, 10 L/min of $NH_3$ and 5 µmol/min of TMG were introduced into an MOCVD apparatus while the temperature of the sapphire substrate 1 was kept at 1100° C., a GaN layer 5 was formed by vertical and lateral epitaxial growth (FIG. 1(h)) mainly on the AlN layer 4a formed on the non-modified portion of the sapphire substrate (FIG. 1(i)). Although the GaN layer 5 is not formed by growth on the AlN layer 4b because the AlN layer 4b formed on the modified portion of the sapphire substrate does not function as a buffer layer for growing the GaN layer 5, the AlN layer 4b adheres to the GaN layer 5 formed by vertical and lateral epitaxial growth mainly on the AlN layer 4a formed on the non-modified portion of the sapphire substrate.

[AlN Buffer Layer Using MOCVD]

If the AlN buffer layer 4 was formed by an MOCVD method using TMA and $NH_3$ contrary to the embodiment, the GaN layer 5 was also formed directly on the AlN buffer layer on the modified portion of the sapphire substrate by epitaxial growth. As a result, efficient selective growth could not be made, so that threading dislocation could not be suppressed.

As described above, it became clear that the formation of the Group III nitride semiconductor after the formation of the AlN buffer layer by reactive sputtering exhibited an effect remarkably different from that in the case where those were replaced by others. The surface modification could be achieved in a very short time because it was unnecessary to use long-term etching or dicing for causing a difference in level. Moreover, because the AlN layer 4b on the modified portion of the sapphire substrate adhered to the GaN layer 5 formed mainly on the AlN layer 4a on the non-modified portion thereof by vertical and lateral epitaxial growth, peeling, cracking or chipping did not occur at the time of separation into devices by dicing, scribing or the like.

Although the embodiment has been described on the case where the sapphire substrate is modified so that stripes are formed on the flat surface of the sapphire substrates the sapphire substrate may be modified partially. For example, modification may be performed so that islands such as dots, stripes, grids, etc. are formed on the flat surface of the sapphire substrate.

In the embodiment of the invention, respective choices can be made from the following options.

As a method for forming each Group III nitride compound semiconductor layer, a metal organic chemical vapor deposition method (MOCVD or MOVPE) is preferable but a molecular beam epitaxy method (MBE), a halide vapor phase epitaxy method (halide VPE), a liquid phase epitaxy method (LPE) or the like may be used. Different epitaxy methods may be used for forming the layers respectively.

The thickness of the buffer layer due to sputtering is not particularly limited but may be desirably in a range of from 5 to 300 nm, more desirably in a range of from 10 to 120 nm, most desirably in a range of from 30 to 90 nm. The depth of etching for modifying the surface of the sapphire substrate is not particularly limited either but may be desirably not smaller than 0.5 nm and not larger than the thickness of the AlN buffer layer 4, more desirably not larger than ½ as large as the thickness of the AlN buffer layer 4, most desirably not larger than 1/10 as large as the thickness of the AlN buffer layer 4.

The invention can be substantially applied to the case where Group III nitride compound semiconductor in the epitaxially laterally overgrown layer and/or the upper layer thereof is formed in the condition that the Group III element as a component is partially replaced by boron (B) or thallium (Tl) while the nitrogen (N) as a component is partially replaced by phosphorus (P), arsenic (As), antimony (Sb) or bismuth (Bi). These elements may be doped with such very small quantities that cannot be expressed as components.

When an n-type Group III nitride compound semiconductor layer is to be formed, Group IV elements or Group VI elements such as Si, Ge, Se, Te, C, etc. may be added as n-type impurities. Group II elements or Group IV elements such as Zn, Mg, Be, Ca, Sr, Ba, etc. may be added as p-type impurities. One layer may be doped with a plurality of impurities or with n-type and p-type impurities.

The etching mask for surface-modifying the face A of sapphire may be selected suitably if it can be removed without any influence on the AlN buffer layer. For example, a metal such as Ni, Ti, Al, or the like; oxide or nitride such as silicon oxide ($SiO_2$), silicon nitride ($Si_3N_4$), titanium oxide ($TiO_x$)), zirconium oxide ($ZrO_x$), or the like; or a multilayer film as a mixture of these may be used. A vapor phase growth method such as vapor deposition, sputtering or CVD or any other suitable method may be used as a method for forming these films.

A semiconductor device such as an FET, a light-emitting device, or the like can be formed on the whole of the Group III nitride compound semiconductor having regions suppressed in terms of threading dislocation or mainly on each of the regions suppressed in terms of threading dislocation. In the case of a light-emitting device, it may be conceived that the light-emitting layer is formed as a multiple quantum well structure (MQW), a single quantum well structure (SQW), a homo structure, a hetero structure or a double hetero structure. Or the light-emitting layer may be formed by means of pin junction, p-n junction or the like.

For example, the aforementioned Group III nitride compound semiconductor having regions suppressed in terms of threading dislocation can be used as a Group III nitride compound semiconductor substrate after the sapphire substrate 1 and the AlN buffer layer 4 are removed. That is, when almost all parts except the vertically and laterally epitaxially grown Group III nitride compound semiconductor are removed, a Group III nitride compound semiconductor substrate can be obtained. When a Group III nitride compound semiconductor the same as or different from the Group III nitride compound semiconductor that has been already formed is then laminated thereon, a Group III nitride compound semiconductor device can be obtained. The Group III nitride compound semiconductor substrate can be also used as a substrate for forming a larger Group III nitride compound semiconductor crystal. Another suitable method besides mechanochemical polishing may be used as the removal method. Also when a Group III nitride compound semiconductor the same as or different from the Group III nitride compound semiconductor that has been already formed is further laminated on the Group III nitride compound semiconductor formed in this embodiment in the condition that the sapphire substrate 1 and the AlN buffer layer 4 are not removed, a Group III nitride compound semiconductor device can be obtained.

Although the invention has been described in detail and with reference to the specific embodiment, it is obvious to those skilled in the art that various changes or modifications may be made without departing from the spirit and scope of the invention.

This application is based on Japanese Patent Application (Japanese Patent Application No. 2002-055094) filed on Feb. 28, 2002, the contents of which are incorporated herein by reference.

INDUSTRIAL APPLICABILITY

An application of the invention in which regions low in threading dislocation are formed on regions high in threading dislocation by using epitaxial lateral overgrowth proposed variously after regions low in threading dislocation are formed by the substrate processing may be included in the invention. For example, after a Group III nitride compound semiconductor layer having regions low in threading dislocation and regions high in threading dislocation is processed so that the regions high in threading dislocation are masked, the masked regions are covered with epitaxial lateral overgrowth according to the invention while surfaces of the nonmasked regions low in threading dislocation are used as seeds. In this manner, a Group III nitride compound semiconductor layer low in threading dislocation as a whole can be obtained. Besides, the second epitaxial lateral overgrowth above the regions high in threading dislocation may be optional.

The invention claimed is:

1. A method of producing a Group III nitride compound semiconductor by growing the Group III nitride compound semiconductor on a sapphire substrate through an AlN buffer layer, comprising:
   modifying at least one part of a surface of said sapphire substrate by dry etching;
   forming said AlN buffer layer on the modified sapphire substrate by means of reactive sputtering with Al as a target in a nitrogen atmosphere; and epitaxially growing said Group III nitride compound semiconductor vertically and laterally on said AlN buffer layer while said AlN buffer layer formed on a non-modified portion of said surface of said sapphire substrate is used as a seed, wherein a difference in level between said at least one part of the surface of the sapphire substrate modified by dry etching and the non-modified portion of said surface of said sapphire substrate is less than 0.1 μm.

2. A method of producing a Group III nitride compound semiconductor according to claim 1, wherein said sapphire substrate comprises a substrate including a face A as its principal surface.

3. A method of producing a Group III nitride compound semiconductor according to claim 1, wherein said modifying said sapphire substrate is carried out so that any one of a dot shape, a stripe shape and a lattice shape is formed as an island shape on a flat surface of said sapphire substrate.

4. A method of producing a Group III nitride compound semiconductor according to claim 1, wherein the depth of etching of said sapphire substrate in said modifying is set to be not larger than the thickness of said AlN buffer layer.

5. A Group III nitride compound semiconductor device comprising a Group III nitride compound semiconductor layer produced by a method of producing a Group III nitride compound semiconductor described in claim 1, and a different type Group III nitride compound semiconductor layer laminated thereon.

6. A method of producing a Group III nitride compound semiconductor substrate, comprising:
a method of producing a Group III nitride compound semiconductor described in claim 1; and
substantially entirely removing other portions than the Group III nitride compound semiconductor epitaxially grown vertically and laterally to thereby obtain said Group III nitride compound semiconductor substrate.

7. A method of producing a Group III nitride compound semiconductor according to claim 1, wherein said modifying said sapphire substrate by dry etching is performed prior to said forming said AlN buffer layer.

8. A method of producing a Group III nitride compound semiconductor according to claim 1, wherein said modified sapphire substrate includes at least one modified sapphire substrate portion and at least one non-modified sapphire substrate portion.

9. A method of producing a Group III nitride compound semiconductor according to claim 8, wherein said AlN buffer layer is formed on the at least one non-modified sapphire substrate portion by reactive sputtering with Al as a target in a nitrogen atmosphere.

10. A method of producing a Group III nitride compound semiconductor according to claim 1, wherein a first portion of said AlN layer formed on the non-modified portion of the sapphire substrate functions as a buffer layer for epitaxially growing said Group III nitride compound semiconductor.

11. A method of producing a Group III nitride compound semiconductor according to claim 1, wherein a second portion of said AlN layer formed on the modified portion of the sapphire substrate is non-functional as a buffer layer for epitaxially growing said Group III nitride compound semiconductor.

12. A method of producing a Group III nitride compound semiconductor by growing the Group III nitride compound semiconductor on a sapphire substrate through an AlN buffer layer, comprising:
dry etching at least one portion of a surface of said sapphire substrate such that said sapphire substrate includes at least one modified sapphire substrate portion and at least one non-modified sapphire substrate portion;

forming said AlN buffer layer on said modified sapphire substrate by reactive sputtering with Al as a target in a nitrogen atmosphere; and epitaxially growing said Group III nitride compound semiconductor vertically and laterally on said AlN buffer layer while said AlN buffer layer formed on said at least one non-modified portion of said surface of said sapphire substrate is used as a seed, wherein a difference in level between said at least one modified sapphire substrate portion and said at least one non-modified sapphire substrate portion is less than 0.1 μm.

13. A method of producing a Group III nitride compound semiconductor according to claim 12, wherein a first portion of said AlN layer formed on the non-modified portion of the sapphire substrate functions as a buffer layer for epitaxially growing said Group III nitride compound semiconductor.

14. A method of producing a Group III nitride compound semiconductor according to claim 12, wherein a second portion of said AlN layer formed on the modified portion of the sapphire substrate is non-functional as a buffer layer for epitaxially growing said Group III nitride compound semiconductor.

15. A method of producing a Group III nitride compound semiconductor according to claim 1, wherein a difference in level between said at least one part of the surface of the sapphire substrate modified by dry etching and the non-modified portion of said surface of said sapphire substrate comprises substantially 2 nm.

16. A method of producing a Group III nitride compound semiconductor according to claim 1, wherein a difference in level between said at least one part of the surface of the sapphire substrate modified by dry etching and the non-modified portion of said surface of said sapphire substrate is formed such that the AlN layer, which is formed on said at least one part of the surface of the sapphire substrate modified by dry etching, is devoid of a poly-crystalline spot when the AlN layer is observed using a Reflection High Energy Electron Diffraction (RHEED) image of the AlN layer.

17. A method of producing a Group III nitride compound semiconductor according to claim 1, wherein said modifying said at least one part of the surface of the sapphire substrate by dry etching comprises:
modifying said at least one part of the surface of the sapphire substrate for preventing a poly-crystalline spot from being included on the AlN layer, which is formed on said at least one part of the surface of the sapphire substrate modified by dry etching, when the AlN layer is observed using a Reflection High Energy Electron Diffraction (RHEED) image of the AlN layer.

18. A method of producing a Group III nitride compound semiconductor according to claim 12, wherein a difference in level between a surface of said at least one modified sapphire substrate portion and a surface of said at least one non-modified sapphire substrate portion comprises substantially 2 nm.

19. A method of producing a Group III nitride compound semiconductor according to claim 12, wherein a difference in level between a surface of said at least one modified sapphire substrate portion and a surface of said at least one non-modified sapphire substrate portion is formed such that the AlN layer, which is formed on said surface of said at least one modified sapphire substrate portion, is devoid of a poly-crystalline spot when the AlN layer is observed using a Reflection High Energy Electron Diffraction (RHEED) image of the AlN layer.

20. A method of producing a Group III nitride compound semiconductor according to claim 12, wherein said dry etching said at least one portion of said surface of said sapphire substrate comprises:

dry etching said at least one portion of said surface of said sapphire substrate for preventing a poly-crystalline spot from being included on the AlN layer, which is formed on said surface of said at least one modified sapphire substrate portion, when the AlN layer is observed using a Reflection High Energy Electron Diffraction (RHEED) image of the AlN layer.

* * * * *